（12）United States Patent
Togami et al.

(10) Patent No.: US 7,229,317 B2
(45) Date of Patent: *Jun. 12, 2007

(54) SHIELDING TABS FOR REDUCTION OF ELECTROMAGNETIC INTERFERENCE

(75) Inventors: Chris Togami, San Jose, CA (US); Gary Sasser, San Jose, CA (US); Andreas Weber, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/405,950

(22) Filed: Apr. 17, 2006

(65) Prior Publication Data

US 2006/0252311 A1    Nov. 9, 2006

Related U.S. Application Data

(63) Continuation of application No. 10/769,196, filed on Jan. 30, 2004, now Pat. No. 7,066,765.

(51) Int. Cl.
 *H01R 13/648* (2006.01)

(52) U.S. Cl. ..................... 439/607
(58) Field of Classification Search .......... 439/352, 439/484, 607, 608, 350
See application file for complete search history.

(56) References Cited

U.S. PATENT DOCUMENTS

| 6,335,869 | B1 | 1/2002 | Branch et al. |
| 6,439,918 | B1 | 8/2002 | Togami et al. |
| 6,494,623 | B1 | 12/2002 | Ahrens et al. |
| 6,744,639 | B1 | 6/2004 | Branch et al. |
| 6,762,940 | B2 | 7/2004 | Zaremba |
| 6,789,958 | B2 | 9/2004 | Ahrens et al. |
| 7,066,765 | B2 * | 6/2006 | Togami et al. .............. 439/607 |
| 2004/0037054 | A1 | 2/2004 | Ice |

OTHER PUBLICATIONS

U.S. Appl. No. 10/389,509, filed Mar. 14, 2003, Togami et al.

* cited by examiner

*Primary Examiner*—Phuong Dinh
(74) *Attorney, Agent, or Firm*—Workman Nydegger

(57) ABSTRACT

An EMI shielding mechanism for use with an electronic module, such as an opto-electronic transceiver module, is disclosed. The EMI shielding mechanism includes a plurality of shielding tabs disposed on an outside face of the module. When the module is fully disposed in a port of a host device, the shielding tabs contact an edge of the port, thus reducing the amount of EMI radiation emitted form that edge. The shielding tabs are angled so that when the module is fully disposed in the port, a portion of the shielding tabs is inside the port and a portion is outside of the port. The angled shielding tabs provide a spring force which assists a user to extract the module from the port.

23 Claims, 4 Drawing Sheets

SHIELDING TABS FOR REDUCTION OF ELECTROMAGNETIC INTERFERENCE

CROSS-REFERENCE TO RELATED APPLICATIONS

This application is a continuation of U.S. patent application Ser. No. 10/769,196 filed on Jan. 30, 2004 now U.S. Pat. No. 7,066,765.

BACKGROUND OF THE INVENTION

1. The Field of the Invention

This invention relates generally to the field of electrical connector systems for electrical components. In particular, embodiments of the present invention relate to a shielding configuration that is particularly useful for use with user-removable, electronic modules that interface with a port of a host device. For example, embodiments of the present invention may find particular use with opto-electronic transceiver modules used to interface a host device with an optical communications network.

2. The Relevant Technology

Fiber optics are increasingly used for transmitting voice and data signals. While optical communications provide a number of advantages, the use of light as a transmission medium presents a number of implementation challenges. In particular, the data carried by a light signal must be converted to an electrical format when received by a device, such as a network switch. Conversely, when data is transmitted to the optical network, it must be converted from an electronic signal to a light signal. A number of protocols define the conversion of electrical signals to optical signals and transmission of those optical, including the ANSI Fibre Channel (FC) protocol. The FC protocol is typically implemented using a transceiver module at both ends of a fiber optic cable. Each transceiver module typically contains a laser transmitter circuit capable of converting electrical signals to optical signals, and an optical receiver capable of converting received optical signals back into electrical signals.

Typically, a transceiver module is electrically interfaced with a host device—such as a host computer, switching hub, network router, switch box, computer I/O and the like—via a compatible connection port. Moreover, in some applications it is desirable to miniaturize the physical size of the transceiver module to increase the port density, and therefore accommodate a higher number of network connections within a given physical space. In addition, in many applications, it is desirable for the module to be hot-pluggable, which permits the module to be inserted and removed from the host system without removing electrical power. For example, the Small Form-factor Pluggable ("SFP") Transceiver MultiSource Agreement ("MSA") was implemented to standardize the physical size and shape of optical transceiver modules to insure compatibility between different manufacturers. In SFP modules, usually a transceiver module is selectively removable from a port which is fixedly attached to the chassis or housing of the host device.

Another design consideration is the amount of electromagnetic interference (EMI) that is radiated by a certain component, module, or system. Equipment such as high speed data systems generate and transmit many signals in the radio frequency portion of the electromagnetic spectrum. EMI radiation is of concern because interference to other components or equipment may result if sufficient power from these signals escapes the equipment enclosures. Such interference may result in malfunctioning of some or all of the electronic system. EMI radiation may also limit the density of components in the system. Various national and international regulatory agencies (e.g., FCC, CISPR, etc.) have set limits for EMI emissions.

Nevertheless, many conventional transceiver configurations lack the ability to adequately reduce EMI emissions. Furthermore, conventional EMI shielding mechanisms often complicate the extraction of the module from the host port, even requiring at times the use of a special extraction tool to allow for access and retrieval of a module in order to not disturb adjacent modules and/or cables. Use of an extraction tool is often not desirable because it raises costs, can be misplaced, and may not be compatible with other module designs.

Therefore, there is a need for a module, such as an optical transceiver module, that has adequate EMI shielding when disposed in the host port and that still complies with existing standards. At the same time, the transceiver module should be easily inserted and extracted from a port without the need for a special extraction tool. Such a module having adequate EMI shielding would allow host systems to provide a higher packing density, and yet allow the use of small form factor transceiver modules that comply with existing sizing standards.

BRIEF SUMMARY OF THE INVENTION

These and other problems are addressed by embodiments of the present invention, which relates to an electronic module that is equipped with a unique EMI shielding mechanism. In an illustrated embodiment, the module is an opto-electronic transceiver module, typically used to interface an optical transmission cable medium to a host device, such as a network switch, hub, router, computer or the like.

In one preferred embodiment, the module is formed as a small form-factor pluggable ("SFP") device in accordance with existing industry standards. Moreover, the module is capable of being operatively received within a compatible port provided by the host device. It will be appreciated that while preferred embodiments are illustrated and described as an opto-electronic transceiver module, the present invention is not limited to that particular environment. Indeed, teachings of the present invention could also be utilized in any type of electronic module.

In an exemplary embodiment, the module includes a base portion that supports a printed circuit board (PCB) upon which is disposed the electronics needed for the functionality of the module. In addition, the PCB has an edge connector formed at one end that is capable of electrically interfacing with the host device when the module is operatively received within the device port. Also disposed on one end of the base portion is at least one receptacle capable of physically receiving and interfacing with a corresponding optical fiber connector, which in turn is connected to a fiber optic cable. In a preferred embodiment, an outer housing encloses at least a portion of the base and the PCB to protect the electronic and optical components from dust and the like. Moreover, the housing defines an outer periphery that conforms in size and shape to the corresponding host port. In one preferred embodiment, the size and shape correspond to specifications defined by the MSA standard. Of course, other shapes and sizes could be used.

In illustrated embodiments, the module includes means for reducing or shielding EMI radiation from the port when the module is disposed therein. In one embodiment, the means for reducing or shielding EMI radiation include one or more shielding tabs formed on the end of the housing. The shielding tabs have sufficient length so that when the module is disposed in the port, at least a portion of the shielding tabs is left disposed outside of the port. In addition, the shielding tabs are preferably angled outward so that at least a portion of each shielding tab abuts or contacts the edge of the opening of the port. Moreover, the shielding tabs are at least partially resilient so that at least a portion of the shielding tab can be disposed within the perimeter of the host port.

The shielding mechanisms significantly and effectively reduce EMI emissions from the opening of the host port without. significantly increasing manufacturing costs. In addition, the angling and resiliency of the shielding tabs additionally provides a spring force which assists in extracting the module from the port. Thus, extraction can be accomplished without the use of a specialized extraction tool, and without disturbing adjacent modules and/or cables. In addition, the shielding tabs allow the module to still conform to existing sizing standards. The shielding mechanism of the present invention may be implemented in any electronic or optoelectronic component requiring EMI radiation shielding.

These and other objects and advantages of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention generally relates to an electronic module, such as an optical transceiver module, that utilizes a unique, effective EMI shielding that still enables the module to be releasably secured within a host slot or port. Moreover, the EMI shielding can be implemented within a transceiver module having a low profile, and complying with existing industry standards, such as those specified in the SFP Transceiver MSA. The EMI shielding permits use of even high-density port configurations, i.e., when the modules are disposed in ports immediately adjacent to one another in one or both lateral dimensions. Further, extraction of the module can be accomplished without the use of a specialized extraction tool, and can be done without disturbing adjacent modules and cables.

Also, while embodiments of the present invention are described in the context of optical transceiver modules used in the field of optical networking, it will be appreciated that the teachings of the present invention are applicable to other applications as well. For example, other types of pluggable electronic modules could utilize embodiments of the EMI shielding to facilitate insertion and extraction from a corresponding host port.

Figure 1:
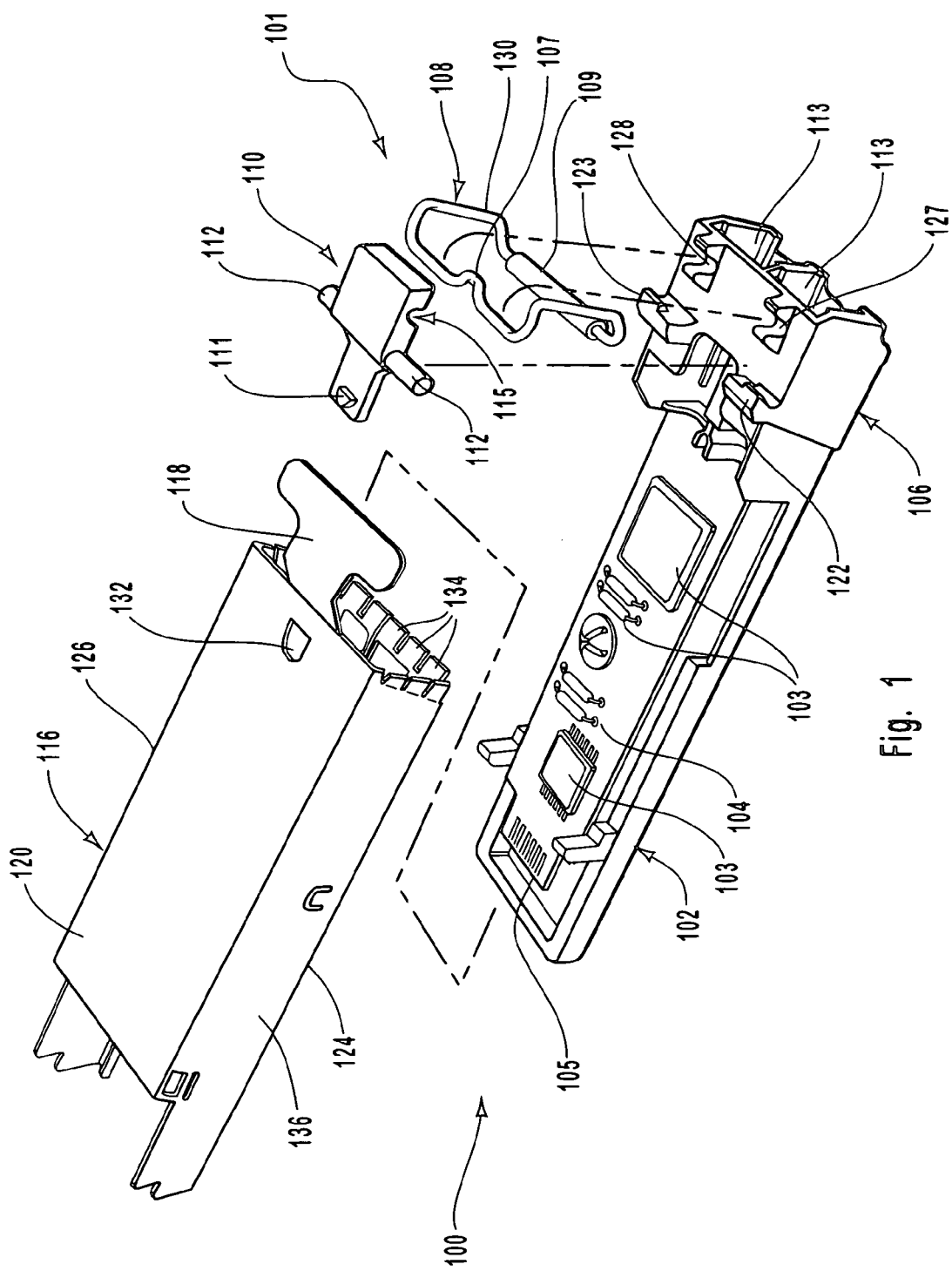
FIG. 1 illustrates an exploded view of an optoelectronic transceiver module according to embodiments of the present invention.
Figure 2:
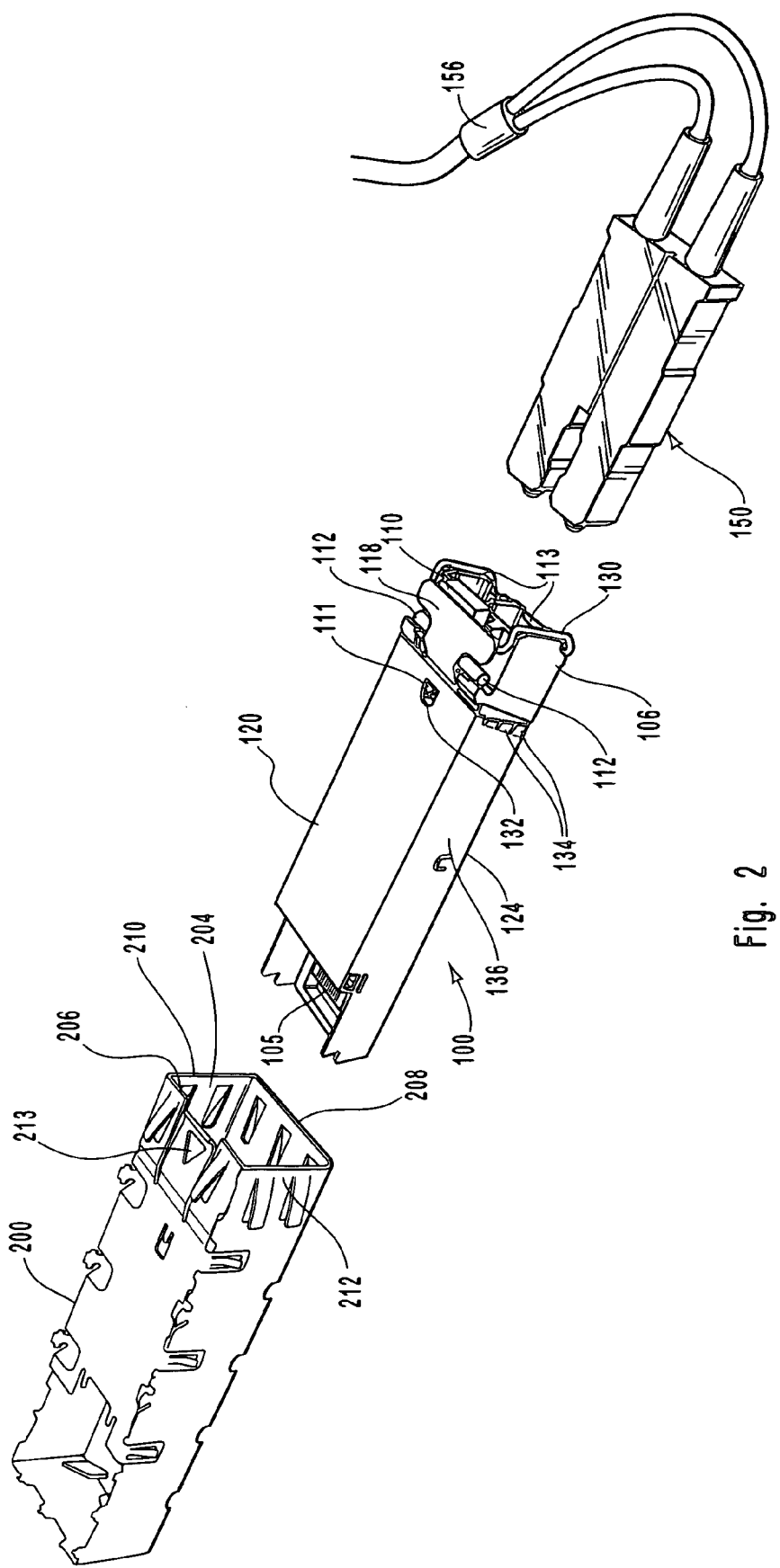
FIG. 2 illustrates an explode view of the optoelectronic transceiver module configured to be connected to a port and an optical cable.

Reference is first made to FIGS. 1 and 2 together, which illustrate perspective views of one presently preferred embodiment of an optical transceiver module, designated generally at 100. In the illustrated example, the module 100 is comprised of an elongated base portion, designated generally at 102, that is configured to support and retain a printed circuit board 104. In this example, the circuit board accommodates the transceiver electronics 103 and optics (not shown), although it could be comprised of any circuitry or components depending on the type of module being used. Also formed on the printed circuit board 104 at a rear end is an exposed edge connector 105. The edge connector 105 is configured to be electrically compatible with a corresponding electrical connector (not shown) that is positioned within the port of a host device. Other connector schemes that are well known in the art could also be used.

In the illustrated embodiment, a connector portion, designated generally at 106, is positioned at one end of the base portion 102. The connector portion 106 defines a receptacle configuration 113 that operatively receives a corresponding modular fiber connector configuration, such as is typically used to interface with an optical fiber cable. One example of such a fiber connector and cable configuration is shown at 150 in FIG. 2. However, it will be appreciated that the receptacle could be implemented to accommodate any one of a number of different connector configurations, depending on the particular application involved.

As is further shown in FIGS. 1 and 2, the module 100 further includes a latching mechanism, designated generally at 101. The latch mechanism 101 provides a mechanism for securing the module 100 within a host port, represented at 200 in FIG. 2, when the module 100 is operatively received within the port. Moreover, the latch mechanism 101 also provides a convenient means for extracting the module 100 from the port, without the need for a special extraction tool. The latching mechanism is preferably implemented so as to preserve the small form factor of the module 100 in accordance with prevailing standards, and in a manner that allows convenient insertion and extraction of a single module without disturbing adjacent modules or adjacent fiber cables—even when used in a host having a high port density.

By way of example and not limitation, in a preferred embodiment the latch mechanism 101 includes a bail, designated generally at 108. Preferably, the bail 108 has a main body portion 130 formed from a rigid metal wire. Bail 108 is sized and shaped so as to be accessible with a user's finger, or any other common implement, such as a pen or the like. Also, the bail 108 is shaped so as to conform substantially with the shape of the module 100 when the bail is placed in a "latched" position, as is represented in FIG. 2. In this way, the bail does not violate the overall low profile presented by the module 100. Also, in one embodiment, the bail 108 includes a grip or clasp 109 that is formed of a material that allows for easier access and gripping by a user's shielding tab. Bail 108 includes a cam that facilitates the latching and unlatching of the module within the port. Dual retention slots 127 and 128 on connector portion 106 are each sized and shaped to pivotally receive bail 108.

Bail 108 is operatively secured to the module 100 by way of an overlying pivot block 110. Pivot block 110 includes a pivot recess 115 that accommodates the cam portion 107 in a manner so as to permit rotation of the bail 108 when connected to connector portion 106. Rotation of the bail 108 causes the cam portion 107 to operatively engage a cam follower surface (not shown) formed on the pivot block 110. Pivot block 110 has a pair of pivot arms 112 which are pivotally connected to the top surface of connector portion 106 at pivot points 122 and 123. Pivot block 110 also includes a lock pin 111 formed along a pivot end thereof.

FIGS. 1 and 2 also illustrate how the base portion 102 and the printed circuit board 104 are at least partially enclosed and retained within an outer housing, designated generally at 116. The outer housing 116 is generally rectangular in shape so as to accommodate the base portion 102. In this embodiment, the outer housing 116 includes a top face 120, bottom face 124, right face 126, and left face 136. The housing 116 includes an opening at the rear end of top face 120 so as to expose the edge connector 105 and thereby permit it to be operatively received within a corresponding electrical connector slot (not shown) within a host port 200. The housing 116 can be formed of any appropriate material and in a preferred embodiment is comprised of sheet metal.

In a preferred embodiment, the housing 116 is also configured so as to provide a portion of the module's latching mechanism 101. For example, the top face 120 of the housing includes a locking recess 132, which is sized and shaped to expose the lock pin 111 of the pivot block 110 when the latch mechanism is in a latched position, as will be described below. Also, the housing 116 includes a leaf spring 118 for biasing the latching mechanism to a latched position. When assembled (FIG. 2), the leaf spring 118 is biased against the top surface of the pivot block 110 so as to operatively secure it in its assembled position. Also, the biasing action is applied so as to urge the pivot block 110 in a rotational direction about pivot point 112 so as to expose lock pin 111 through locking recess 132.

In general, the relative position of the bail 108 governs the operational state of the latching mechanism 101. In the latched position, bail 108 is rotated and placed in a downward direction, as is shown in FIG. 2. Thus, lock pin 111 is then able to engage with a corresponding notch or recess 213 that is formed within the port 200. This engagement effectively "latches" the module 100 within the port 200.

In an unlatched position, the bail 108 is rotated upwardly to place the latch mechanism 101 into an "unlatched" position. In this unlatched state, the user can remove the module 100 from the port. Since the bail 108 extends out in front of the module 100, extraction can be accomplished without having to grip the sides of the module, and without disturbing and/or otherwise inadvertently affecting the connection status of an adjacent module or fiber cable. Also, the shape and configuration of the bail 108 insures that it cannot be rotated to the unlatched position while a connector 150 is disposed within the modular receptacle 113. This prevents accidental removal of the module 100 from the port by inadvertently pulling on the connector 150 or cable 156.

Further details regarding the latch mechanism may be found in U.S. Pat. No. 6,439,918, U.S. Pat. No. 6,533,603, and U.S. patent application Ser. No. 10/389,509, filed Mar. 14, 2003, all entitled "Electronic Module Having an Integrated Latching Mechanism" all of which are incorporated herein by reference.

With reference to FIG. 2, an assembled transceiver 100 including base portion 102 disposed within housing 116 is adapted to be disposed in a port 200. That is, port 200 includes an opening 204 configured to receive module 100. In turn, port 200 is configured to be attached to a host 202. Opening 204 of port 200 includes a top edge 206, a bottom edge 208, a right edge 210 and a left edge 212.

When operatively received within the port 200, the edge connector 105 is received within a corresponding electrical connector (not shown) disposed within the port 200, so as to provide the requisite electrical interface between the transceiver module 100 and the host 202. Also, at this point the modular cable connector 150 of the optical cable 156 can be received within the receptacle 113 of the connector portion 106.

In one embodiment, port 200 is suitable for making a transceiver module hot-pluggable, for example, in accordance with SFP standards. One system for connecting port 200 to a host or chassis system is found in U.S. patent application Ser. No. 10/638,981, filed Aug. 12, 2003 and entitled "Card Cage System," which application is incorporated herein by reference.

It has been found that when module 100 is disposed in port 200 and during operation that EMI radiation occurs out the opening 204 of port 200. Thus, with reference back to FIG. 1, housing 116 further includes means for shielding or reducing EMI radiation through opening 204 of port 200. In one embodiment, means for shielding or reducing EMI radiation through port 200 include a plurality of shielding tabs 134 formed on the front end of housing 116. In FIG. 1, shielding tabs 134 are formed on the bottom face 124, right face 126 and left face 136 of housing 116. The shielding tabs 134 are configured to engage or abut a corresponding edge of opening 204 of port 200.

Means for shielding or reducing EMI radiation through port 200 may also include the interface between leaf spring 118 of housing 116 and pivot points 122 and 123 of connector portion 106. That is, leaf spring 118 and pivot points 122 and 123 form a tongue-and-groove configuration which substantially blocks EMI radiation through top edge 206 of port 200. However, in embodiments where latch mechanism 101 is not employed, top face 120 of housing 116 may also include shielding tabs 134 formed thereat in order to reduce EMI radiation out of top edge 206 of port 200.

Figure 3A:
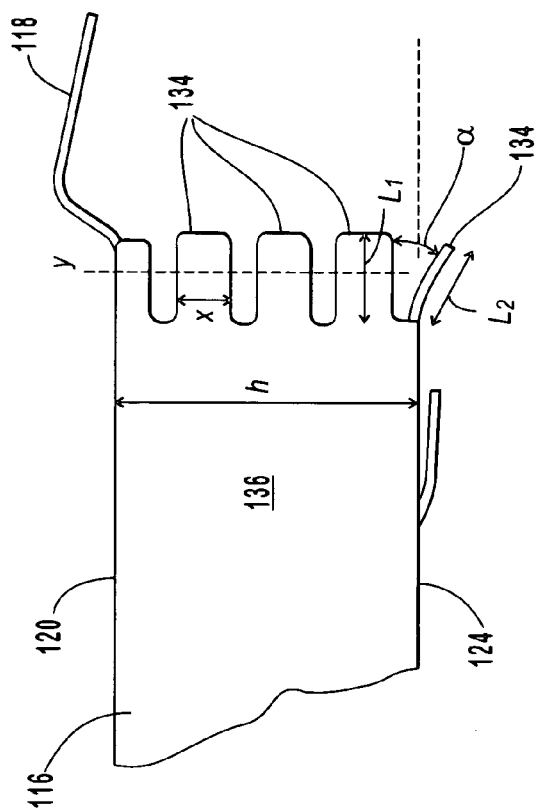
FIG. 3A illustrates a side plan view of an embodiment of the housing of an optoelectronic transceiver module.
Figure 3B:
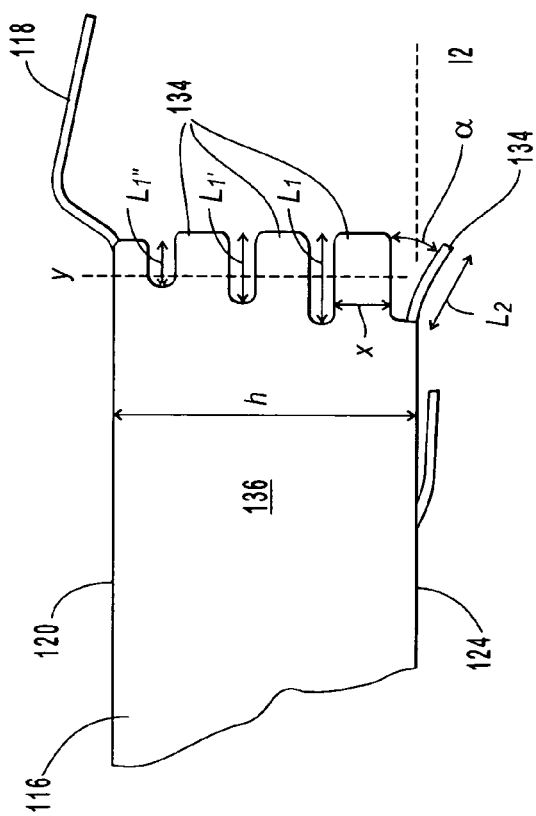
FIG. 3B illustrates a side plan view of another embodiment of the housing of an optoelectronic transceiver module.

Turning now to FIG. 3A and FIG. 3B, shielding tabs 134 are shown in greater detail. Specifically, FIG. 3A is a side view of housing 116 without base 102 disposed therein. Shielding tabs 134 are shown formed on bottom face 124 and left face 136 of housing 116. Shielding tabs 134 on bottom face 124 cooperate with the bottom edge 208 of port 200 to shield EMI radiation from that side. Similarly, shielding tabs 134 on left face 136 cooperate with left edge 212 of port 200 to shield EMI radiation therefrom. Thus, shielding tabs 134 may be formed on any face of housing 116 to shield EMI radiation from any corresponding edge of port 200.

In a preferred embodiment, shielding tabs 134 cooperate with port 200 to block a substantial amount of EMI radiation being emitted from any one edge of port 200 when module 100 is disposed therein. Accordingly, substantially the entire height h of right face 126 or left face 136 has shielding tabs 134 formed along the length thereof. Similarly, substantially the entire length of bottom face 124 has shielding tabs 134 formed along the length thereof. In one embodiment, substantially EMI radiation shielding may be accomplished by forming one shielding tab 134 on each face of housing 116 requiring EMI radiation shielding, the size of each shielding tab being substantially the same length as the face to which it corresponds. The configuration of one (1) shielding tab on a particular face of housing 116 results in at least 95% of the length of the corresponding edge being shielded from EMI radiation.

In another embodiment at least 85% of the length of each face of housing 116 contains shielding tabs 134. The following table summarizes the size configurations for an exemplary embodiment, which is provided by way of explanation and not limitation. As shown therein, the size x of shielding tabs 134 may be about 1 mm to about 2 mm. In a port 200 having left edge 212 of about 9 mm and a housing having three (3) shielding tabs 134 formed on the left face 136 and a height h of about 8 mm, this results in about 50% of the left edge being shielded from EMI radiation. The same port 200 having a bottom edge 208 of 14 mm and the housing having six (6) shielding tabs on the bottom face 124, the shielding tabs each having a size x of 4 mm and the bottom face having a width of 13 mm results in about 64% of the bottom edge being shielded from EMI radiation.

|  | Left Face of Housing | Left Edge of Port | Bottom Face of Housing | Bottom Edge of Port |
|---|---|---|---|---|
| Length | 8 mm | 9 mm | 13 mm | 14 mm |
| No. Shielding tabs | 3 | N/A | 6 | N/A |
| Size x of shielding tabs | 1.5 mm | N/A | 1.5 mm | N/A |
| Per. of edge in contact with shielding tabs | 50% | | 64% | |

Note that because the shielding tabs 134 on the bottom face 124 and the side faces 126, 136 are discrete structures, a corner space of port 200 may exhibit some EMI radiation. However, opening 204 may be configured with corner pieces which help to reduce EMI radiation at the corners of port 200.

As shown in FIGS. 3A and 3B, shielding tabs 134 have a particular length. The length of shielding tabs 134 on side faces 126 or 136, $L_1$, may differ from those formed on bottom face 124, $L_2$. Preferably, the lengths of shielding tabs 134 are long enough such that when module 100 is disposed in port 200, the tips of shielding tabs 134 are exposed. In other words, shielding tabs 134 are never fully disposed in port 200. In one embodiment, the length $L_1$ of side face 126, 136 shielding tabs 134 are about 1.5 to 2.5 mm while the length $L_2$ of bottom face 124 shielding tabs 134 are about 1.5 mm to 2.5 mm.

In some embodiments, the lengths of shielding tabs 134 on a particular side may differ. For example, in FIG. 3A, the lengths of shielding tabs 134 on left face 136 are the same, while in FIG. 3B, the lengths of shielding tabs 134 differ on the left face 136. This may depend on design configurations, for example, the ease with which module 10 is inserted into port 200. In one embodiment, the lengths $L_1$, $L_1'$ and $L_1''$ of shielding tabs 134 on left face 136 are about 2 mm, 1.5 mm and 1 mm, respectively.

In addition, shielding tabs 134 are preferably angled so that at least a portion of the shielding tab contacts the corresponding edge of port 200 when module 100 is fully disposed in port 200. Shielding tabs 134 on a particular face of housing 116 preferably have the same angle so that each of the shielding tabs contacts the corresponding edge. When module 100 is fully disposed in port 200, a substantial portion of the edge of port 200 is in contact with shielding tabs 134. In one embodiment, the angle α is about 20° to about 45°. Furthermore, while shielding tabs 134 are shown as linear members, the shielding tabs may be curved or otherwise bent in order to satisfy various design requirements.

Figure 4:
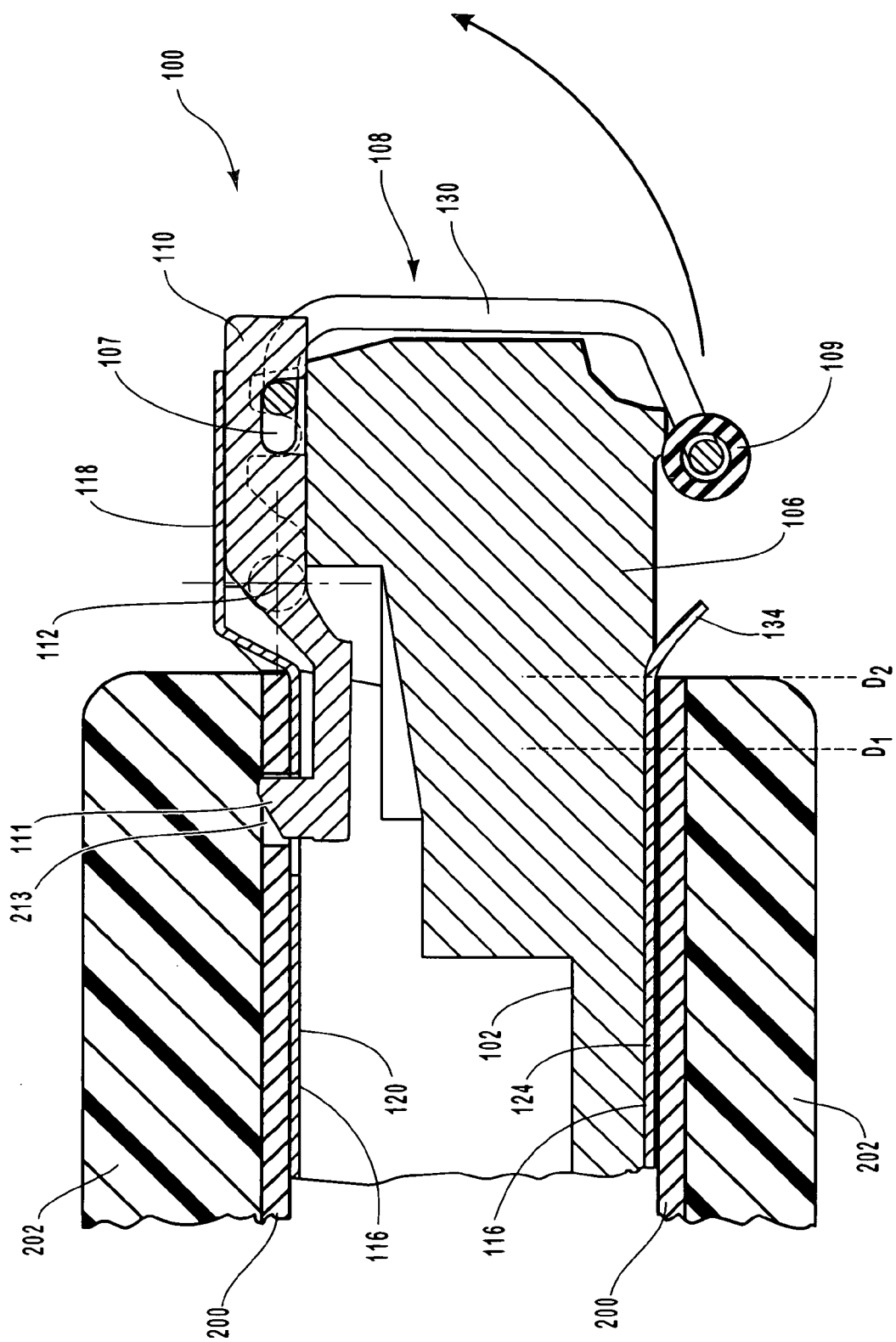
FIG. 4 illustrates a cross-sectional view of an optoelectronic transceiver module disposed in a port.

Preferably shielding tabs 134 are formed of a resilient material so that at least a portion thereof can somewhat straighten when that portion is disposed in port 200. FIG. 4 shows module 100 disposed in port 200. Distance $D_1$ corresponds to the beginning of shielding tab 134 on bottom face 124 of housing 116. Distance $D_2$ corresponds to the end of bottom edge 208 of port 200. Thus, preferably, the portion of shielding tab 134 between distances $D_1$ and $D_2$ resiliently flexes so as to be easily disposed within the perimeter of port 200. However, the portion of shielding tab 134 past distance $D_2$ to the end of shielding tab 134 continues to be angled outward.

Angling shielding tabs 134 outward also provides a spring force that actually assists in the removal of module 100 from port 200. That is, as latch 101 is unlatched, the pivoting of block 110 against leaf spring 118 serves to partially force module 100 from port 200. In addition, as module 100 becomes disengaged from port 200, the resilient shielding tabs 134 tend to bias back to their original angled position. The spring force of all of the shielding tabs against opening 204 of port 200 provides additional extraction force of module 100 from port 200, even without the use of additional extraction tools or manual means to remove module 100. Thus, module 100 is easily removed from port 200.

In addition, the length and angle of shielding tabs 134 are configured so that the shielding tabs 134 can be disposed within port 200 while still maintaining the required profile, for example, the SFP standard.

The shielding tabs 134 are preferably formed of a material which is effective for shielding EMI emissions. In one embodiment, shielding tabs are a metal such as a stainless steel, aluminum, silver, nickel, iron, lead, or other metal alloys. The shielding material may also be a carbon-based materials such as graphite. In another embodiment, shielding tabs may be formed of a metal-loaded plastic material. The shielding tabs 134 of the present invention may be formed by any known metallization process such as stamping, welding, soldering, and the like. In addition, the shielding tabs may be formed from a molding process or connected to the housing by adhesive, epoxy and the like. Finally, the shielding tabs 134 may be coated with an EMI radiation protective coating made from materials including, but not limited to, those cited above.

It has been found that use of shielding tabs 134 on modules 100 is effective in reducing EMI emissions when module 100 is disposed in port 200. While some embodiments described herein have included a separate housing having a base disposed therein, it will be appreciated that shielding tabs 134 may be effective when formed on any outside face of a module that is configured to be disposed within a corresponding port, and that the present invention is not limited to the use of a separate base and housing. For example, an electronic module only having an outer housing with the base formed integrally therein may benefit from the use of shielding tabs disposed on the outside face of the housing.

It will be appreciated that shielding tabs 134 may be used on any transceiver module or component requiring EMI shielding, with or without use of the particular latch mechanism disclosed herein.

To summarize, embodiments of the present invention provide a number of advantages over existing electronic module designs. The disclosed electronic module utilizes a unique, but simple, EMI shielding mechanism that effectively reduces EMI radiation from the component. The EMI shielding mechanism of the present invention does not significantly increase manufacturing costs. In addition, the EMI shielding mechanism allows the module to be easily extracted from a host port without the need for specialized extraction tools. Finally, the EMI shielding mechanism is implemented in a manner so as to preserve the overall low profile presented by the module, as is required by existing industry standards.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electronic module housing configured to be received within a port of a host, the housing comprising:
   an opening configured to allow electrical connection between a printed circuit board within the housing and a host connector when the electronic module is received within the port; and
   at least one shielding tab formed on a face of the housing, the at least one shielding tab depending from the face of the housing at an angle to the housing, the at least one shielding tab being sized and configured to apply a spring force to a first edge of the port when the electronic module is received within the port such that the spring force assists in extraction of the module from the port when the module is removed from the port.

2. The housing as recited in claim 1, wherein at least a portion of the at least one shielding tab remains outside the opening of the port when the electronic module is received within the port.

3. The housing as recited in claim 1, wherein the housing is substantially rectangular in cross-sectional shape defining four faces, wherein the housing encloses at least a portion of the printed circuit board.

4. The housing as recited in claim 1, wherein a plurality of shielding tabs are formed on edges located on three faces of the housing and a latching mechanism is located upon a fourth face of the housing.

5. The housing as recited in claim 1, wherein the angle of the at least one shielding tab with respect to the housing is between about 20 degrees and about 45 degrees.

6. The housing as recited in claim 1, wherein the at least one shielding tab is at least partially curved outward away from the housing along substantially the entire length of the at least one shielding tab.

7. The housing as recited in claim 1, wherein a second edge of the port is opposite to the first edge of the port, the spring force urging the module away from the first edge of the port and toward the second edge of the port to reduce EMI radiation through the opening of the port.

8. The housing as recited in claim 7, wherein the spring force reduces space between a face of the housing and the second edge of the port to reduce EMI radiation through the opening of the port.

9. The housing as recited in claim 1, wherein a top face of the housing includes a locking recess that is sized and shaped to expose a locking pin of a latching mechanism to secure the housing within the port.

10. An electronic module comprising:
    a printed circuit board including an interface configured to electrically connect the printed circuit board with a host device when the module is received within a port of the host device;
    a housing including:
       an opening;
       an interior portion that at least partially encloses the printed circuit board; and
       at least one shielding tab disposed on a face of the housing, the at least one shielding tab depending outwardly from the housing at an angle to the housing such that at least a portion of the at least one shielding tab remains outside the opening of the port when the housing is received within the port.

11. The module as recited in claim 10, wherein the at least one shielding tab contacts a first edge of the port thereby applying a spring force against the first edge of the port.

12. The module as recited in claim 10, wherein the at least one shielding tab is formed of a resilient material and the angling and resiliency of the at least one shielding tab assists in extracting the module from the port.

13. The module as recited in claim 10, wherein the housing has a substantially rectangular cross-sectional shape and encloses the printed circuit board on at least four sides.

14. The module as recited in claim 10, wherein a plurality of shielding tabs are formed on edges located along three sides of the housing and a latching mechanism is located upon a fourth side of the housing.

15. The module as recited in claim 10, wherein a top face of the housing includes a locking recess that is sized and shaped to expose a locking pin to secure the module within the port.

16. The module as recited in claim 10, wherein the angle of the at least one shielding tab with respect to the housing is between about 20 degrees and 45 degrees.

17. The module as recited in claim 10, wherein the at least one shielding tab is at least partially curved outward in a direction away from the module along substantially an entire length of the at least one shielding tab.

18. The module as recited in claim 10, wherein at least a portion of the at least one shielding tab resiliently flexes so as to be disposed within a perimeter of the port when the module is received within the port.

19. The module as recited in claim 10, wherein a second edge of the port engages a portion of a latching mechanism coupled to the module to provide EMI shielding.

20. The module as recited in claim 19, wherein the latching mechanism further comprises:
    a locking pin; and
    a bail that is operatively attached to the module so as to be selectively moveable between at least a first and a second position.

21. The module as recited in claim 10, wherein the second edge of the port is opposite to the first edge of the port, the spring force urging the module away from the first edge of the port and toward the second edge of the port to reduce EMI radiation through the opening of the port.

22. An electronic module comprising:
a printed circuit board including an interface configured to electrically connect the printed circuit board with a host device when the module is received within a port of the host device;
a housing including:
   an opening;
   an interior portion that at least partially encloses the printed circuit board; and
   at least one shielding tab disposed on a face of the housing, the at least one shielding tab depending outwardly at an angle from the housing such that at least a portion of the at least one shielding tab contacts an edge of the port when the housing is received within the port, wherein the housing is secured to a wall of the port and at least partially enclosed within the port when it is received within the port.

23. The module as recited in claim 22, wherein the housing has a substantially rectangular cross-sectional shape and encloses the printed circuit board on at least four sides and wherein the port has a substantially rectangular cross-sectional shape and encloses the module on at least four sides when then module is received by the port.

* * * * *

UNITED STATES PATENT AND TRADEMARK OFFICE
CERTIFICATE OF CORRECTION

PATENT NO. : 7,229,317 B2 Page 1 of 1
APPLICATION NO. : 11/405950
DATED : June 12, 2007
INVENTOR(S) : Togami et al.

It is certified that error appears in the above-identified patent and that said Letters Patent is hereby corrected as shown below:

Column 3
Line 12, after "without" delete "."

Signed and Sealed this

Sixteenth Day of February, 2010

David J. Kappos
*Director of the United States Patent and Trademark Office*